United States Patent
Nakamura et al.

[11] Patent Number: 5,949,900
[45] Date of Patent: Sep. 7, 1999

[54] FINE PATTERN INSPECTION DEVICE CAPABLE OF CARRYING OUT INSPECTION WITHOUT PATTERN RECOGNITION

[75] Inventors: Toyokazu Nakamura; Yoshikazu Komatsu, both of Tokyo, Japan

[73] Assignee: NEC Corporation, Tokyo, Japan

[21] Appl. No.: 08/814,342

[22] Filed: Mar. 11, 1997

[30] Foreign Application Priority Data

Mar. 11, 1996 [JP] Japan .................................. 8-053484
Mar. 7, 1997 [JP] Japan .................................. 9-052728

[51] Int. Cl.$^6$ ................................ G06K 9/00; H04N 7/18
[52] U.S. Cl. ........................ 382/145; 382/141; 382/144; 382/147; 382/149; 348/126
[58] Field of Search .................................. 382/141, 144, 382/145, 147, 149; 348/126

[56] References Cited

U.S. PATENT DOCUMENTS

| | | | |
|---|---|---|---|
| 4,794,646 | 12/1988 | Takeuchi et al. | 382/149 |
| 4,860,371 | 8/1989 | Matsuyama et al. | 382/149 |
| 4,953,224 | 8/1990 | Ichinose et al. | 382/149 |
| 5,023,917 | 6/1991 | Bose | 382/149 |
| 5,146,509 | 9/1992 | Hara et al. | 382/149 |
| 5,452,368 | 9/1995 | LeBeau | 382/145 |

FOREIGN PATENT DOCUMENTS 61-200415 9/1986 Japan .

*Primary Examiner*—Phuoc Tran
*Assistant Examiner*—Daniel G. Mariam
*Attorney, Agent, or Firm*—Sughrue, Mion, Zinn, Macpeak & Seas, PLLC

[57] ABSTRACT

In a fine pattern inspection device for inspecting a fine pattern comprising a plurality of pattern elements which have the same form and which are formed on an inspection sample, the device detects a defect in the plurality of pattern elements by the use of an image derived from the fine pattern. An image obtaining unit obtains the image from the fine pattern and produces an image signal representing the image. The image signal is divided into first and second divided image signals. A processing unit extracts a defect image and an inverted defect image that is inverted in lightness of the defect image, by carrying out a first process that gives a predetermined delay to the first divided image signal and then inverts the lightness thereof to obtain a processed image signal and carrying out a second process that adds the processed image signal and the second divided image signal to obtain a difference image signal representing a difference image which includes the defect image and the inverted defect image. A display device displays the defect image and the inverted defect image.

14 Claims, 7 Drawing Sheets

| | | | | | | |
|---|---|---|---|---|---|---|
| ORIGINAL IMAGE | | A | A | A | A' | A |
| PRIMARY DELAYED IMAGE | A | A | A' | A | A | |
| PRIMARY LIGHTNESS INVERTED IMAGE | [A] | [A] | [A'] | [A] | [A] | |
| SECONDARY DELAYED IMAGE | A | A | A' | A | A | |
| SECONDARY LIGHTNESS INVERTED IMAGE | [A] | [A] | [A'] | [A] | [A] | |
| PRIMARY DIFFERENCE IMAGE | | [A] | | ['] | ' | A |
| SECONDARY DIFFERENCE IMAGE | [A] | | ['] | ' | | A |
| PRIMARY ABSOLUTE IMAGE | | \|[A]\| | | \|[']\| | \|'\| | \|A\| |
| SECONDARY ABSOLUTE IMAGE | \|[A]\| | | \|[']\| | \|'\| | \|A\| | |
| SELECTED IMAGE | | | | \|'\| | | |

FIG. 6

FINE PATTERN INSPECTION DEVICE CAPABLE OF CARRYING OUT INSPECTION WITHOUT PATTERN RECOGNITION

BACKGROUND OF THE INVENTION

This invention relates to a fine pattern inspection device for inspecting a fine pattern comprising a plurality of pattern elements which have the same form. Such a fine pattern inspection device is particularly useful in inspection for a wafer of a semiconductor memory device such as a DRAM (Dynamic Random Access Memory) in which a plurality of memory cells are formed in array and for a mask which is used for fabricating the semiconductor memory device.

An example of the fine pattern inspection device is disclosed in Japanese Unexamined Patent Publication No. 200415/1986 (Tokkai sho 61-200415). The pattern inspection device comprises an image obtaining unit for obtaining an image of the fine pattern as an inspection image. The image obtaining unit produces an image signal representing the inspection image. The image signal is stored into an image memory as a stored image signal. The pattern inspection device further comprises an auxiliary memory memorizing a reference image signal as a stored reference image signal. The reference image signal represents a reference image of the fine pattern that has no defect. The stored image signal is compared with the stored reference image signal by the use of a pattern recognition method which is known in the art.

In the fine pattern inspection device mentioned above, it is required to provide with the auxiliary memory having a large capacity. This means that the fine pattern inspection device becomes large in size. Furthermore, it is required to match the inspection image with the reference image for pattern recognition. It is therefore required to have a matching time duration for the pattern recognition. This means that an inspection time duration becomes long.

SUMMARY OF THE INVENTION

It is therefore an object of the present invention to provide a fine pattern inspection device which is capable of carrying out inspection of a fine pattern without pattern recognition.

Other object of the present invention will become clear as the description proceeds.

A fine pattern inspection device according to the present invention is for inspecting a fine pattern comprising a plurality of pattern elements which have the same form and which are formed on an inspection sample, in order to detect a defect in the plurality of pattern elements by the use of an image derived from the fine pattern.

According to an aspect of the present invention, the device comprises an image obtaining unit for obtaining the image from the fine pattern to produce an image signal representing the image. The image signal comprises a plurality of pattern element image signals each of which lasts for a predetermined time duration. The image signal is divided into first and second divided image signals. The device further comprises a processing unit supplied with the first and the second divided image signals for extracting a defect image and an inverted defect image that is inverted in lightness of the defect image, by carrying out a first process that gives a predetermined delay to the first divided image signal and then inverts the lightness thereof to obtain a processed image signal and carrying out a second process that adds the processed image signal and the second divided image signal to obtain a difference image signal representing a difference image which includes the defect image and the inverted defect image. The device still further comprises image displaying unit supplied with the difference image signal for displaying the defect image and the inverted defect image.

According to another aspect of the present invention, the device comprises an image obtaining unit for obtaining the image from the fine pattern to produce an image signal representing the image. The image comprises a plurality of fine pattern element image signals each of which lasts for a predetermined time duration. The image signal is divided into first and second divided image signals. The device further comprises a primary processing unit supplied with the first and the second divided image signals for extracting a primary defect image and a primary inverted defect image that is inverted in lightness of the primary defect image by carrying out a primary first process that gives a predetermined delay to the first divided image signal to produce a primary delayed image signal and then inverts the lightness of the primary delayed image signal to produce a primary inverted image signal in order to obtain a primary processed image signal and carrying out a primary second process that adds the primary processed image signal and the second divided image signal to obtain a primary difference image signal representing a primary difference image which includes the primary defect image and the primary inverted defect image. The device still further comprises a secondary processing unit supplied with the primary delayed image signal for extracting a secondary defect image and a secondary inverted defect image that is inverted in lightness of the secondary defect image by carrying out a secondary first process that gives the predetermined delay to the primary delayed image signal to produce a secondary delayed image signal and then inverts the lightness of the secondary delayed image signal to produces a secondary inverted image signal in order to obtain a secondary processed image signal and carrying out a secondary second process that adds the secondary processed image signal and the primary delayed image signal to obtain a secondary difference image signal representing a secondary difference image which includes the secondary defect image and the secondary inverted defect image. The device yet further comprises a first absolute-value circuit supplied with the primary difference image signal for carrying out absolute operation of the primary difference image signal in each of the pattern element images to produce a primary absoluted image signal, a second absolute-value circuit supplied with the secondary difference image signal for carrying out the absolute operation of the secondary difference image signal in each of the pattern element images to produce a secondary absoluted image signal, a selecting circuit supplied with the primary and the secondary absoluted image signals for selecting in each of the pattern element images one absoluted image signal that is lower, in absolute value, than another absoluted image signal from the primary and the secondary absoluted image signals to produce a selected image signal representing a selected image which includes the defect image, and an image displaying unit supplied with the selected image signal for displaying the defect image.

BRIEF DESCRIPTION OF THE DRAWING

FIG. 6 is an illustration for describing process operation of first and second processing units shown in FIG. 5.

DESCRIPTION OF THE PREFERRED EMBODIMENT

Figure 1:
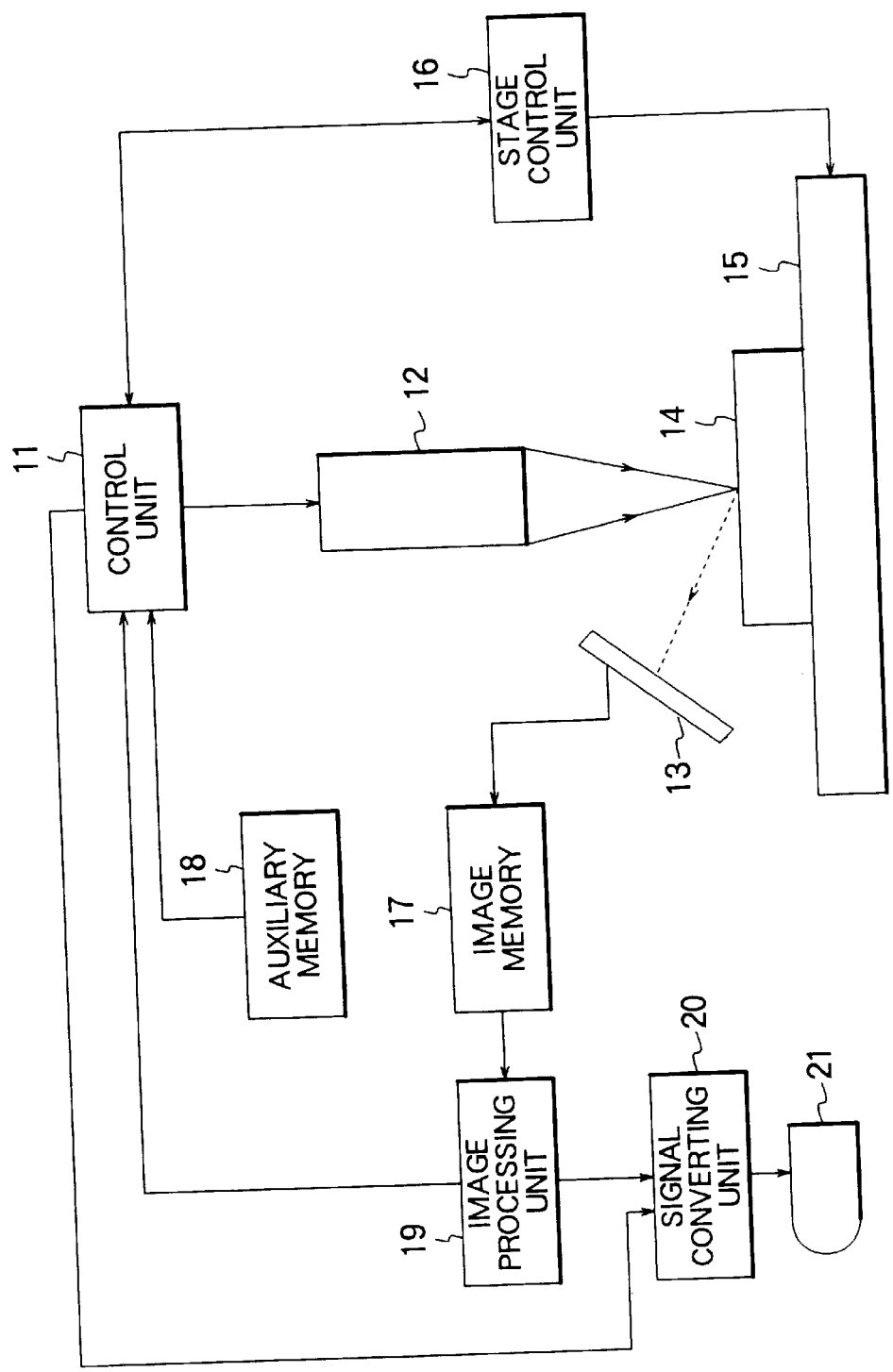
FIG. 1 shows a block diagram of a conventional fine pattern inspection device.

Referring to FIG. 1, a description will be made with regard to a conventional fine pattern inspection device in order to facilitate a better understanding of the present invention.

The fine pattern inspection device comprises a control unit 11, a beam injector 12, and an image detector 13. Under the control of the control unit 11, the beam injector 12 scans an inspection sample 14 mounted on a stage 15 by a focusing electron beam. The inspection sample 14 has a fine pattern on a surface thereof. The fine pattern comprises a plurality of pattern elements, such as memory cells, which have the same form. Although not depicted in FIG. 1, the fine pattern inspection device comprises a moving mechanism. The stage 15 can be moved by the moving mechanism under the control of the control unit 11 through a stage control unit 16. The stage control unit 16 delivers positional information indicative of a position of the stage 15 to the control unit 11.

The image detector 13 receives a reflected electron beam reflected from the subject sample 14 and converts the reflected electron beam into an image signal. The beam injector 12, the image detector 13, the stage 15, and the stage control unit 16 may collectively be called an image obtaining unit.

The image signal represents the image of the fine pattern formed on the inspection sample 14 as an inspection image. The image signal is stored into an image memory 17 as a stored image signal. An auxiliary memory 18 memorizes a reference image signal as a stored reference image signal. The reference image signal represents a reference image of the fine pattern that has no defect. An image processing unit 19 is supplied with the stored image signal and the stored reference image signal and compares the stored image signal with the stored reference image signal by the use of a pattern recognition method which is known in the art. If a defect is present at least one of the pattern elements of the fine pattern formed on the inspection sample 14, the image processing unit 19 detects the defect as a defect pattern element having the defect. This is because the inspection image is different from the reference image at the defect pattern element. In other words, the defect pattern element is different in form from a normal pattern element which has no defect. The image processing unit 19 further detects a position of the defect pattern element on the inspection image and delivers positional information indicative of a detected position of the defect pattern element to the control unit 11. By the use of the positional information delivered from the stage 15 and the positional information of the defect pattern element derived from the image processing unit 19, the control unit 11 calculates a position of the defect pattern element on the inspection sample 14 as a calculated position. As a result, the position of the defect pattern element is indicated by the position in the inspection sample 14 by the calculated position. The control unit 11 supplies a position signal indicative of the the position of the defect pattern element to a signal converting unit 20. The signal converting unit 20 is for converting the position signal into an image display signal for displaying by a display unit 21. Thus, the position of the defect pattern element is displayed by the display unit 21 together with the inspection image including a defect image of the defect pattern element.

In the fine pattern inspection device mentioned above, it is required to provide with the auxiliary memory 18 having a large capacity. This means that the fine pattern inspection device becomes large in size. Moreover, it is required to match the inspection image with the reference image for the pattern recognition. It is therefore required to have a matching time duration for the pattern recognition. This means that an inspection time duration required to carry out the inspection operation becomes long. Furthermore, in order to carry out the pattern recognition with high accuracy, it is necessary to carry out the moving of the stage 15 with high accuracy. As a result, the moving mechanism becomes complex in structure and becomes large in size.

Figure 2:
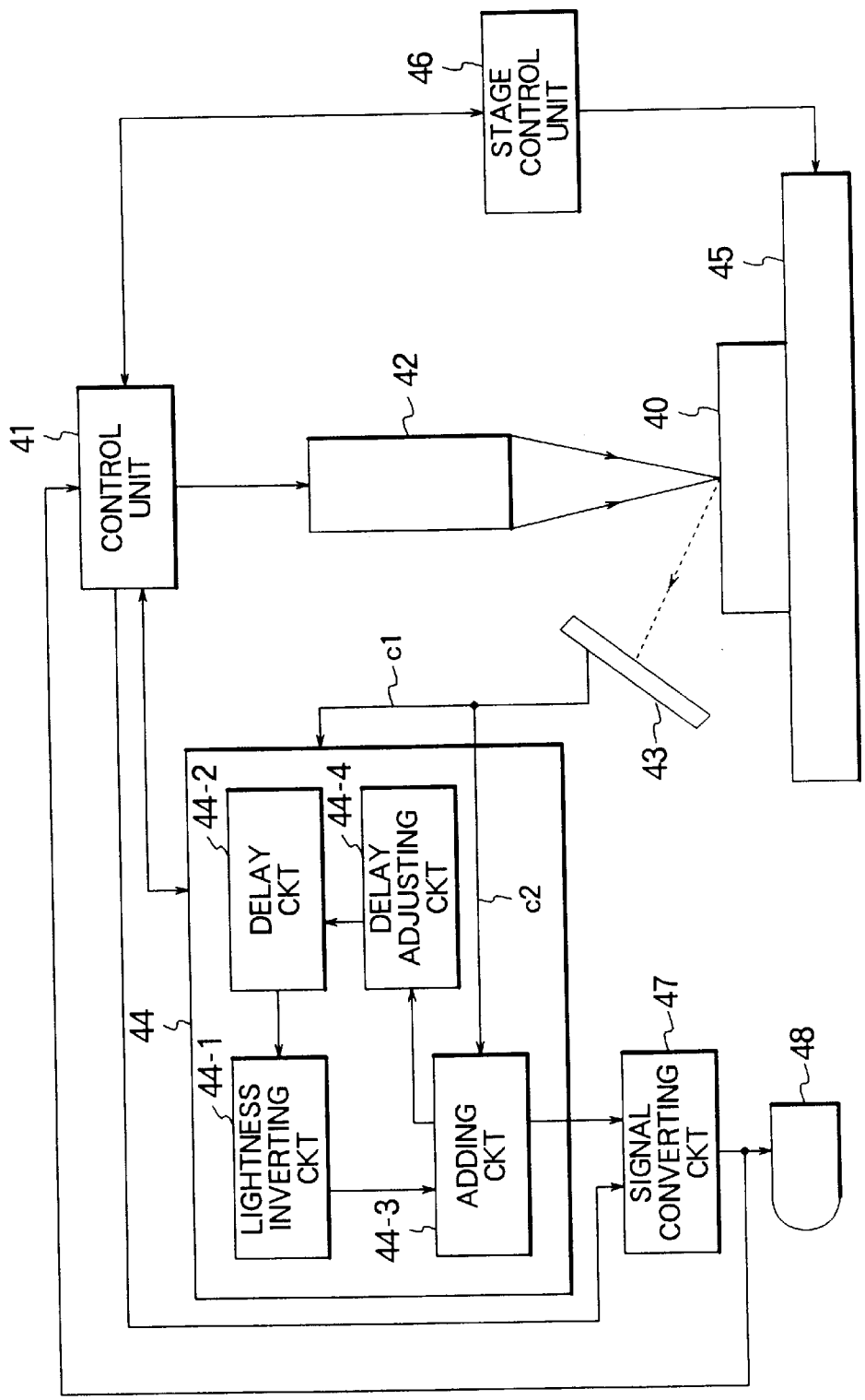
FIG. 2 shows a block diagram of a fine pattern inspection device according to a first embodiment of the present invention.

Referring to FIG. 2, the description will proceed to a fine pattern inspection device according to a first embodiment of the present invention. The fine pattern inspection device is for inspecting a fine pattern comprising a plurality of pattern elements which have the same form and which are formed on an inspection sample 40. The fine pattern inspection device is particularly useful in inspection for a wafer of a semiconductor memory device such as a DRAM (Dynamic Random Access Memory) in which a plurality of memory cells are formed in array and for a mask which is used for fabricating the semiconductor memory device.

The fine pattern inspection device comprises a control unit 41, an image obtaining unit comprising an electron beam injector 42 and an image detector 43, and a processing unit 44. The image obtaining unit is for obtaining an image of the fine pattern from the inspection sample 40. In addition to the electron beam injector 42 and the image detector 43, the image obtaining unit further comprises a stage 45 for mounting the inspection sample 40 and a stage control unit 46. The stage 45 is movable by a moving mechanism (not shown) in X and Y directions on a horizontal plane. The moving mechanism is controlled by the stage control unit 46 under the control of the control unit 41. Such an image obtaining unit can be implemented by a scanning electron microscope. The stage 45 and the stage control unit 46 are used for setting an inspection area onto the inspection sample 40. The electron beam injector 42 scans the inspection area by a focusing electron beam. The stage control unit 46 supplies a position signal to the control unit 41. The position signal indicates a position of the stage 45 and a position of the inspection area on the inspection sample 40. The image detector 43 receives a reflected electron beam reflected from the inspection sample 40 and converts the reflected electron beam into an image signal. The image signal represents an image in the inspection area. If a plurality of pattern elements are present in the inspection area, the image signal comprises a plurality of pattern element image signals representing a plurality of pattern element images which correspond to the plurality of pattern elements. The image signal is divided into first and second divided image signals c1 and c2. The first and the second divided image signals c1 and c2 are supplied to the processing unit 44. After completion of scanning operation, the inspection area is shifted to another area of the inspection sample 40 by moving the stage 45.

The processing unit 44 comprises a delay circuit 44-2, a lightness inverting circuit 44-1, an adding circuit 44-3, and a delay adjusting circuit 44-4. The first divided image signal c1 is supplied to the delay circuit 44-2. The delay circuit 44-2 is for giving a predetermined delay to the first divided image signal c1 and delivers a delayed image signal to the lightness inverting circuit 44-1. The lightness inverting circuit 44-1 is for inverting lightness of the delayed image signal and delivers a lightness inverted image signal to the adding circuit 44-3. The adding circuit 44-3 is supplied with the second divided image signal c2 in addition to the lightness inverted image signal. The adding circuit 44-3 is for adding the lightness inverted image signal and the second divided image signal and produces a difference image signal representing a difference image. The reason why the adding circuit 44-3 produces the difference image signal will later become clear.

Figure 3:
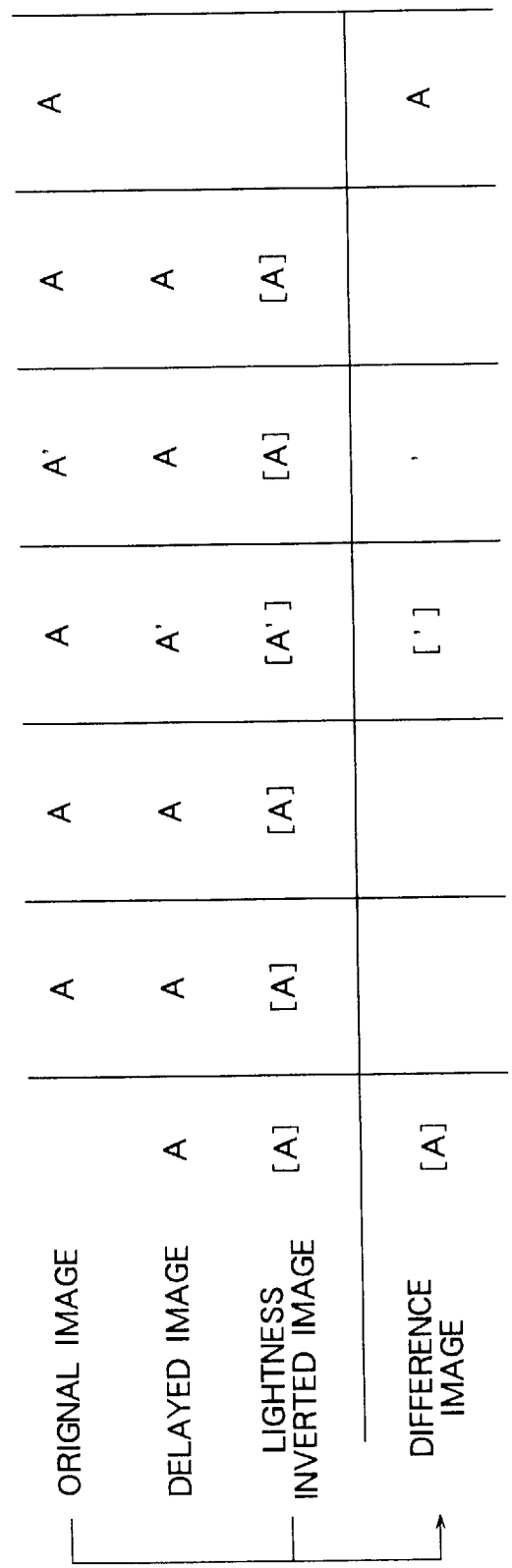
FIG. 3 is an illustration for describing process operation of a processing unit shown in FIG. 2.

Referring to FIG. 3 together with FIG. 2, the above-mentioned process will be described in detail. In FIG. 3, let the inspection area have pattern elements of six in number and one of the pattern elements has a defect. In this case, the image detector 43 produces the image signal representing the image which comprises the pattern element images of six in number. Let each of the pattern element images has a predetermined cycle period T. This means that each of the pattern element image signals lasts for a predetermined time duration which is equal to the predetermined cycle period T. The image represented by the image signal will be called hereinafter an original image. In the original image shown in a top line of FIG. 3, each of the pattern element images is symbolically depicted at "A". In particular, the pattern element image having the defect is depicted at "A'" and will be called a defect pattern element image.

In the example, the delayed image signal derived from the delay circuit 44-2 represents a delayed image comprising delayed pattern element images which are shifted, in time duration, from the original image. As shown in a second line of FIG. 3, if the predetermined delay is equal to the predetermined cycle period T, one of the pattern element images can overlaps perfectly one of the delayed pattern element images that is derived from another one of the pattern element images adjacent to the one of the pattern element images.

The lightness inverted image signal derived from the lightness inverting circuit 44-3 represents a lightness inverted image in which the delayed image is inverted in lightness. In this event, the original and the delayed images are positive images while the lightness inverted image is an negative image. The lightness inverted image comprises lightness inverted pattern element images. As shown in a third line of FIG. 3, the lightness inverted pattern element image having no defect is depicted at "[A]" while the lightness inverted pattern element image having the defect is depicted at "[A']". By adding operation of the adding circuit 44-3, the lightness inverted image signal is added to the second divided image signal having the original image. By this adding operation, the pattern element image "A" is deleted because all of the pattern elements have the same form, and because the original image is the position image while the lightness inverted image is the negative image. As shown in a bottom line of FIG. 3, the difference image is a residual image and includes a defect image "" and an inverted defect image "[']" that is inverted in lightness of the defect image. The difference image further comprises the lightness inverted pattern element image "[A]" positioned at one end of the lightness inverted image and the pattern element image "A" positioned at another end of the original image. This is because the above-mentioned adding operation is not effective to two pattern element images which are positioned at the both ends. These two pattern element images are unnecessary and are therefore disregarded as will later be described.

Next, the description will proceed to the operation of the delay adjusting circuit 44-4. The delay adjusting circuit 44-4 is supplied with the difference image signal from the adding circuit 44-3. The delay adjusting circuit 44-4 is for controlling the delay circuit 44-2 so as to have the predetermined delay which is equal to the predetermined cycle period T. For this purpose, the delay adjusting circuit 44-4 detects a variance value of the lightness in the difference image signal and adjusts the predetermined delay so that the variance value becomes equal to a minimum value. Although the variance value of the lightness in the difference image signal is used in order for adjusting the predetermined delay, this is based on the following reason.

The variance value of the lightness changes with a rate of overlap between the lightness inverted image and the original image. In particular, when the lightness inverted image overlaps perfectly with the original image, the variance value of the lightness becomes equal to the minimum value.

The delay adjusting circuit 44-4 may previously have a predetermined threshold value with regard to the variance of the lightness. In this case, the delay adjusting circuit 44-4 adjusts the predetermined delay so that the variance value of the difference image signal becomes lower than the predetermined threshold value. In FIG. 3, although the predetermined delay is equal to the predetermined cycle period T, the predetermined delay may be equal to a several times the predetermined cycle period T.

The device still further comprises an image displaying unit which comprises a signal converting circuit 47 and a display device 48. The signal converting circuit 47 is supplied with the difference image signal and converts the difference image signal into a converted image signal that is suitable for displaying by the display device 48. The display device 48 displays the difference image shown in the bottom line of FIG. 3. An operator for inspection can identifies that the fine pattern of the inspection sample 40 has the defect pattern element by watching the defect image "" and the inverted defect image "[']" displayed by the display device 48. The operator disregards the two pattern element images "[A]" and "A" as unnecessary pattern element images because these two pattern element images are normal images.

By the way, the inspection sample 40 has a reference position predetermined thereon. The defect image and the inverted defect image can be defined by positional information on the difference image. In other words, the position of the defect pattern element can be defined by positional information in the inspection area. The control unit 41 is supplied with the converted image signal and the position signal delivered from the stage control unit 46. The control unit 41 calculates, at first, the position of the inspection area on the inspection sample 40 by the use of the position signal and the reference position. Next, the control unit 41 detects the position of the defect pattern element, as the positional information, on the inspection area by the use of the converted image signal. Then, the control unit 41 calculates a position of the defect pattern element on the inspection sample 40 as a calculated position. For example, the calculated position is represented by coordinate system related to the reference position. The control unit 41 delivers a position indication signal representative of the calculated position to the signal converting circuit 47. Thus, the display device 48 displays the calculated position together with the defect image and the inverted defect image.

The above-mentioned process is repeated by shifting the inspection area until the inspection operation is carried out to the whole of the inspection sample 40.

In addition, the operator can adjust the predetermined delay by manual operation. This can be realized by the following manner. In FIG. 3, if the lightness inverted image partially overlaps with the original image, the difference image comprises the pattern element images each of which is like a ghost image. However, the ghost image disappears when the predetermined delay becomes equal to the predetermined cycle period T. Under the circumstances, the delay adjusting circuit 44-4 is provided with an adjuster for adjusting the predetermined delay. Such an adjuster can be implemented by a knob which is manually operated by the operator. In this event, the operator watches the display image on the display device 48 and operates the knob so that the ghost image disappears. It is desirable that each of the delay circuit 44-2, the lightness inverting circuit 44-1, the adding circuit 44-3, and the delay adjusting circuit 44-4 is implemented by an LSI (Large Scale Integrated circuit). In this case, the processing unit 44 can carries out the above-mentioned process at an incremented process speed.

For example, when the inspection is carried out to a semiconductor wafer of the DRAM having a capacity which is equal to 256 Mega-bits by using the fine pattern inspection device according to the first embodiment, it is possible to detect the defect pattern element and the position thereof at a high speed which is faster than five times the speed obtained by the conventional fine pattern inspection device described in conjunction with FIG. 1.

The description will proceed to a modification of the fine pattern inspection device illustrated in FIG. 2. In the modification, the image obtaining unit is implemented by a confocal laser beam microscope. The confocal laser beam microscope comprises similar parts designated by like reference numerals except that the laser beam injector injects a confocal laser beam. The confocal laser beam has permeability to the inspection sample. This means that the confocal laser beam can focus into an inner area in thickness direction of the inspection sample and that it is possible to detect the defect in the inner area of the inspection sample. The fine pattern inspection device is suitable for inspecting the semiconductor wafer of the DRAM having the capacity which is equal to 64 Mega-bits. When the inspection is carried out to the semiconductor wafer of the DRAM having the capacity which is equal to 64 Mega-bits by using the fine pattern inspection device according to the modification, it is possible to detect the defect pattern element and the position thereof at a high speed which is faster than five times the speed obtained by the conventional fine pattern inspection device described in conjunction with FIG. 1.

Figure 4:
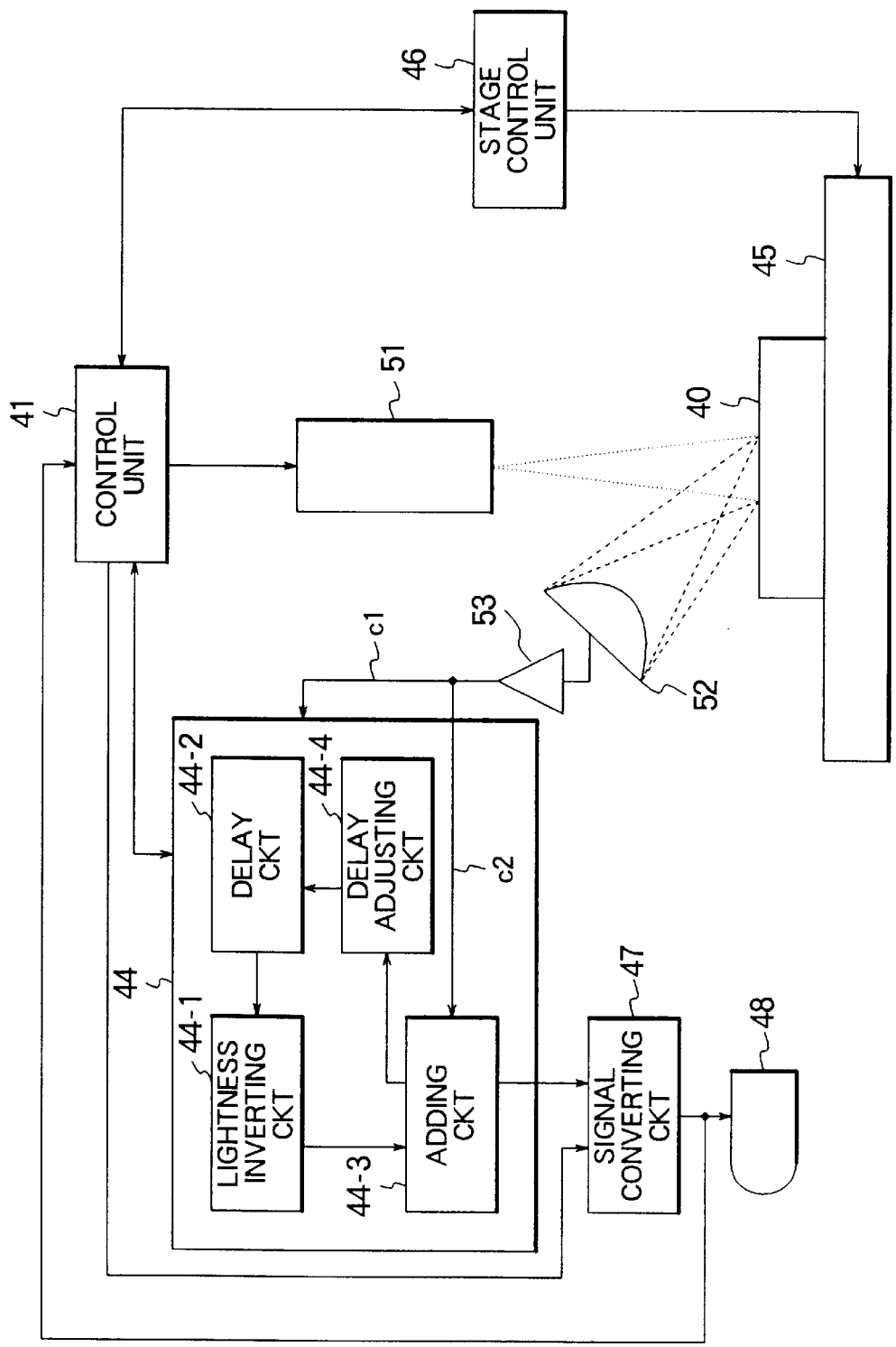
FIG. 4 shows a block diagram of a fine pattern inspection device according to a second embodiment of the present invention.

Referring to FIG. 4, the description will proceed to a fine pattern inspection device according to a second embodiment of the present invention. The fine pattern inspection device according to the second embodiment comprises similar parts illustrated in FIG. 2 except for an image obtaining unit. The image obtaining unit comprises a light source 51 for irradiating light onto the inspection sample 40, an image pickup device 52 for picking up the image of the fine pattern by detecting reflection light reflected from the inspection sample 40, and a serial/parallel converting circuit 53. The light source 51 can be implemented by a halogen lamp while the image pickup device 52 can be implemented by a one-dimensional CCD (Charge Coupled Device) array. In this event, the one-dimensional CCD array produces a parallel image signal. The serial/parallel converting circuit 53 converts the parallel image signal into a serial image signal as the image signal. The stage 45 and the stage control unit 46 serves as a scanning unit by moving the inspection sample 40. In other words, the one-dimensional CCD array can scans the inspection area of the inspection sample 40 by moving the inspection sample 40. Such the scanning operation may be realized by moving the one-dimensional CCD array and the halogen lamp. Furthermore, the image pickup device 52 may be implemented by a two-dimensional CCD array. In this case, it is unnecessary to move the two-dimensional CCD array.

When the inspection is carried out to the semiconductor wafer of the DRAM having the capacity which is equal to 16 Mega-bits by using the fine pattern inspection device according to the second embodiment, it is possible to detect the defect pattern element and the position thereof at a high speed which is faster than five times the speed obtained by the conventional fine pattern inspection device described in conjunction with FIG. 1.

Figure 5:
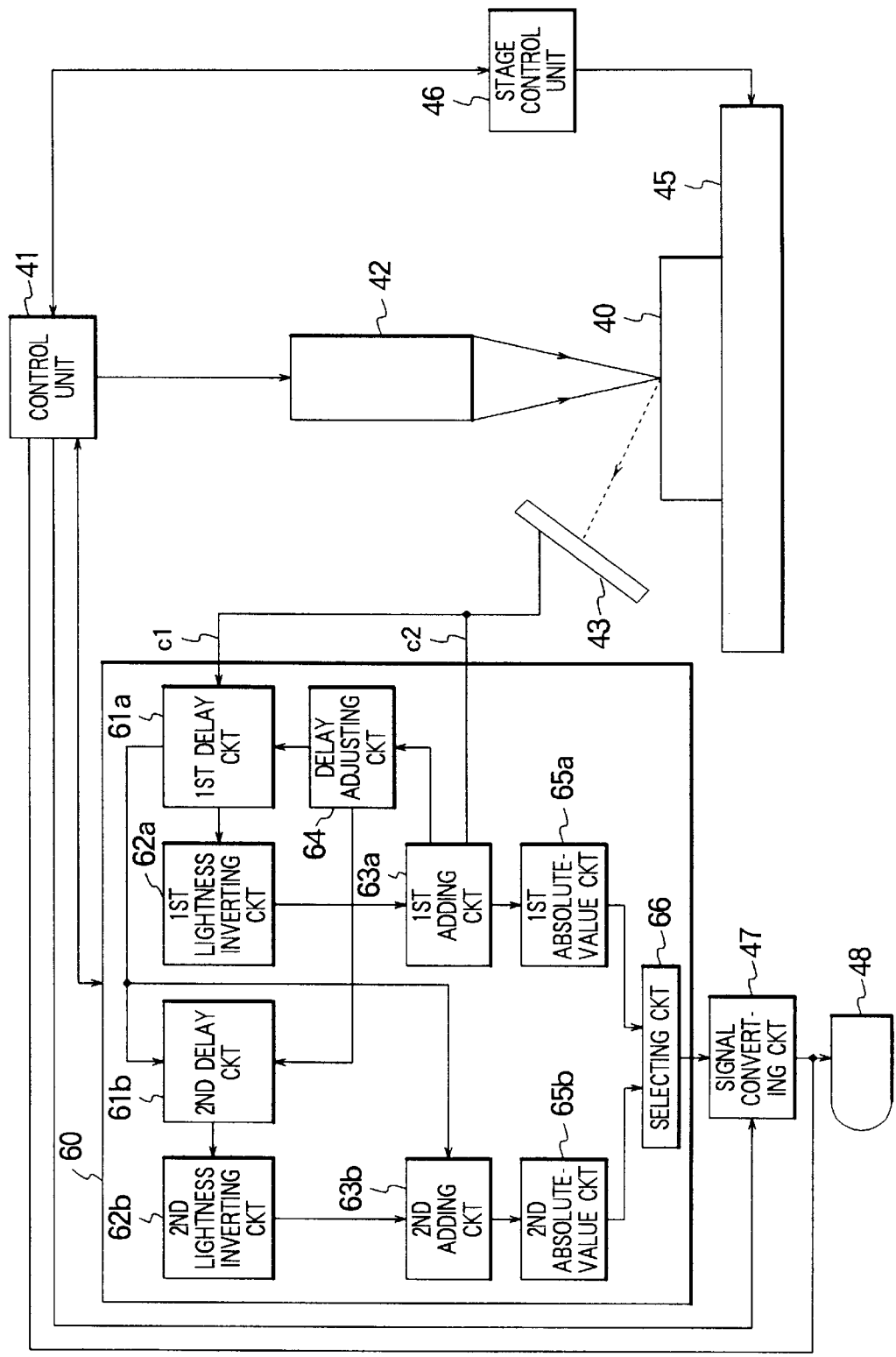
FIG. 5 shows a block diagram of a fine pattern inspection device according to a third embodiment of the present invention.

Referring to FIG. 5, the description will be made with regard to a fine pattern inspection device according to a third embodiment of the present invention. The fine pattern inspection device is for detecting only the defect image "" mentioned in conjunction with FIG. 3. This is because the difference image derived from the adding circuit 44-3 includes the lightness inverted pattern element image "[A]" and the pattern element image "A", as the unnecessary pattern element images, as mentioned in relation to FIG. 3.

The fine pattern inspection device comprises similar parts designated by like reference numerals in FIG. 2 except that an enlarged processing unit 60 is provided in place of the processing unit 44 shown in FIG. 2. Therefore, operation of the image obtaining unit will be omitted. The enlarged processing unit 60 comprises first and second delay circuits 61a and 61b, first and second lightness inverting circuits 62a and 62b, first and second adding circuits 63a and 63b, and a delay adjusting circuit 64. The first delay circuit 61a, the first lightness inverting circuit 62a, the first adding circuit 63a, and the delay adjusting circuit 64 may collectively be called a primary processing unit. The second delay circuit 61b, the second lightness inverting circuit 62b, and the second adding circuit 63b may collectively be called a secondary processing unit. The primary processing unit carries out processing operation similar to that of the processing unit 44 mentioned in conjunction with FIGS. 2 and 3.

The first divided image signal c1 is supplied to the first delay circuit 61a. The first delay circuit 61a gives the predetermined delay to the first divided image signal c1 and delivers a primary delayed image signal to the first lightness inverting circuit 62a. The first lightness inverting circuit 62a inverts the lightness of the primary delayed image signal and delivers a primary lightness inverted image signal to the first adding circuit 63a. The first adding circuit 63a adds the primary lightness inverted image signal and the second divided image signal c2 and produces a primary difference image signal.

In the secondary processing unit, the second delay circuit 61b is supplied with the primary delayed image signal from the first delay circuit 61a. The second delay circuit 61b gives the predetermined delay to the primary delayed image signal and delivers a secondary delayed image signal to the second lightness inverting circuit 62b. The second lightness inverting circuit 62b inverts the lightness of the secondary delayed image signal and supplies a secondary lightness inverted image signal to the second adding circuit 63b. The second adding circuit 63b is also supplied with the primary delayed image signal from the first delay circuit 61a. The second adding circuit 63b adds the secondary lightness inverted image signal from the primary delayed image signal and produces a secondary difference image signal.

The delay adjusting circuit 64 adjusts the predetermined delay of the first and the second delay circuits 61a and 61b in the manner mentioned in conjunction with FIGS. 2 and 3.

The enlarged processing unit 60 further comprises first and second absolute-value circuits 65a and 65b and a selecting circuit 66. The first absolute-value circuit 65a carries out absolute operation of the primary difference image signal in each of the pattern element images and produces a primary absoluted image signal. Similarly, the second absolute-value circuit 65b carries out the absolute operation of the secondary difference image signal in each of the pattern element images and produces a secondary absoluted image signal. The selecting circuit 66 is supplied with the primary and the secondary absoluted image signals. The selecting circuit 66 is for selecting in each of the pattern element images one absoluted image signal that is lower, in an absolute-value, than another absoluted image signal from the primary and the secondary absoluted image signals. The selecting circuit 66 produces a selected image signal representing a selected image which will shortly be described.

Referring to FIG. 6 together with FIG. 5, the description will be made with regard to the processing operation of the enlarged processing unit 60. In FIG. 6, let the inspection area has the pattern elements of six in number and one of the pattern elements has the defect. In this case, the image signal represents an original image comprising the pattern element images of six in number as shown in a top line of FIG. 6. Each of the pattern element images has the predetermined cycle period T. As mentioned in relation to FIG. 3, each of the pattern element images in the original image is depicted at "A". The defect pattern element image is depicted at "A'".

In the example, the primary delayed image signal derived from the first delay circuit 61a represents a primary delayed image comprising primary delayed pattern element images which are shifted, in time duration, from the original image. As shown in a second line of FIG. 6, if the predetermined delay is equal to the predetermined cycle period T, one of the pattern element images can overlaps perfectly one of the primary delayed pattern element images that is derived from another one of the pattern element images adjacent to the one of the pattern element images.

The primary lightness inverted image signal derived from the first lightness inverting circuit 62a represents a primary lightness inverted image in which the primary delayed image is inverted in lightness. In this event, the original and the primary delayed images are positive images while the primary lightness inverted image is an negative image. The primary lightness inverted image comprises primary lightness inverted pattern element images. As shown in a third line of FIG. 6, the primary lightness inverted pattern element image having no defect is depicted at "[A]" while the primary lightness inverted pattern element image having the defect is depicted at "[A']". The first adding circuit 63a adds the primary lightness inverted image signal and the second divided image signal c2 having the original image and produces the primary difference image signal representing a primary difference image. By this adding operation, the pattern element image "A" is deleted for the same reason mentioned in relation to FIG. 3. As shown in a sixth line of FIG. 6, the primary difference image includes the defect image "'" and the inverted defect image "[']" that is inverted in lightness of the defect image "'". The primary difference image further comprises the primary lightness inverted pattern element image "[A]" and the pattern element image "A" for the same reason mentioned in relation to FIG. 3.

The secondary delayed image signal derived from the second delay circuit 61b represents a secondary delayed image comprising secondary delayed pattern element images which are shifted, in time duration, from the primary delayed image. As shown in a fourth line of FIG. 6, if the predetermined delay is equal to the predetermined cycle period T, one of the primary delayed pattern element images can overlaps perfectly one of the secondary delayed pattern element images that is derived from another one of the primary delayed pattern element images adjacent to the one of the primary delayed pattern element images.

The secondary lightness inverted image signal derived from the second lightness inverting circuit 62b represents a secondary lightness inverted image in which the secondary delayed image is inverted in lightness. The secondary lightness inverted image is an negative image while the secondary delayed image is a positive image. The secondary lightness inverted image comprises secondary lightness inverted pattern element images. As shown in a fifth line of FIG. 6, the secondary lightness inverted pattern element image having no defect is depicted at "[A]" while the secondary lightness inverted pattern element image having the defect is depicted at "[A']". The second adding circuit 63b adds the secondary lightness inverted image signal and the primary delayed image signal having the primary delayed image and produces the secondary difference image signal representing a secondary difference image. By this adding operation, the pattern element image "A" is deleted. As shown in a seventh line of FIG. 6, the secondary difference image includes the defect image "'" and the inverted defect image "[']". The secondary difference image further comprises the secondary lightness inverted pattern element image "[A]" and the primary delayed pattern element image "A" for the same reason mentioned in relation to FIG. 3.

The first absolute-value circuit 65a carries out the absolute operation to the primary difference image signal and produces the primary absoluted image signal. The absolute operation is carried out in each of the pattern element images. As shown in an eighth line of FIG. 6, the primary absoluted image comprises a primary absoluted defect image "|'|", a primary absoluted inverted defect image "|[']|", a primary absoluted lightness inverted pattern element image "|[A]|", and a primary absoluted pattern element image "|A|". Similarly, the second absolute-value circuit 65b carries out the absolute operation and produces the secondary absoluted image signal. As shown in a ninth line of FIG. 6, the secondary absoluted image comprises a secondary absoluted defect image "|'|" a secondary absoluted inverted defect image "|[']|", a secondary absoluted lightness inverted pattern element image "|[A]|", and a secondary absoluted delayed pattern element image "|A|".

The selecting circuit 66 is supplied with the primary and the secondary absoluted image signals. The selecting circuit 66 carries out selection operation in each of the pattern element images and selects one absoluted image signal that is lower, in an absolute-value, than another absoluted image signal from the primary and the secondary absoluted image signals. The selecting circuit 66 produces the selected image signal representing the selected image. As shown in a bottom line of FIG. 6, the selected image has only the primary absoluted defect image "|'|" as the defect pattern element image. By this selection operation, the unnecessary pattern element images can be deleted.

In FIG. 6, although the predetermined delay is equal to the predetermined cycle period T, the predetermined delay may be equal to a several times the predetermined cycle period T.

The signal converting circuit 47 is supplied with the selected image signal and converts the selected image signal into a converted image signal that is suitable for displaying by the display device 48. The display device 48 displays the selected image shown in the bottom line of FIG. 6. The operator can identifies that the fine pattern of the inspection sample 40 has the defect pattern element by watching the defect pattern element image displayed by the display device 48.

As mentioned in conjunction with FIGS. 2 and 3, the inspection sample 40 has the reference position predetermined thereon. The defect pattern element image can be defined by the positional information on the selected image. In other words, the position of the defect pattern element can be defined by positional information in the inspection area. The control unit 41 is supplied with the converted image signal and the position signal delivered from the stage control unit 46. The control unit 41 calculates the position of the inspection area on the inspection sample 40 by the use of the position signal and the reference position. Next, the control unit 41 detects a position of the defect pattern element image, as the positional information, on the inspection area by the use of the converted image signal. Then, the control unit 41 calculates a position of the defect pattern element on the inspection sample 40 as a calculated position. For example, the calculated position is represented by coordinate system related to the reference position. The control unit 41 delivers position indication signal representative of the calculated position to the signal converting circuit 47. Thus, the display device 48 displays the calculated position together with the defect pattern element image.

The operator may adjust the predetermined delay by manual operation in the manner mentioned in conjunction with FIGS. 2 and 3. It is desirable that each of the primary and the secondary processing units, the first and the second absolute-value circuits 65a and 65b, and the selecting circuit 66 is implemented by an LSI (Large Scale Integrated circuit).

For example, when the inspection is carried out to a semiconductor wafer of the DRAM having a capacity which is equal to 256 Mega-bits by using the fine pattern inspection device according to the third embodiment, it is possible to detect the defect pattern element and the position thereof at a high speed which is faster than five times the speed obtained by the conventional fine pattern inspection device described in conjunction with FIG. 1.

The description will proceed to a modification of the fine pattern inspection device illustrated in FIG. 5. In the modification, the image obtaining unit is implemented by the confocal laser beam microscope. The confocal laser beam microscope comprises similar parts designated by like reference numerals except that the laser beam injector injects the confocal laser beam. The confocal laser beam has permeability to the inspection sample. This means that the confocal laser beam can focuses into an inner area in thickness direction of the inspection sample and that it is possible to detect the defect in the inner area of the inspection sample. The fine pattern inspection device is suitable for inspecting the semiconductor wafer of the DRAM having the capacity which is equal to 64 Mega-bits. When the inspection is carried out to the semiconductor wafer of the DRAM having the capacity which is equal to 64 Mega-bits by using the fine pattern inspection device according to the modification, it is possible to detect the defect pattern element and the position thereof at a high speed which is faster than five times the speed obtained by the conventional fine pattern inspection device described in conjunction with FIG. 1.

Figure 7:
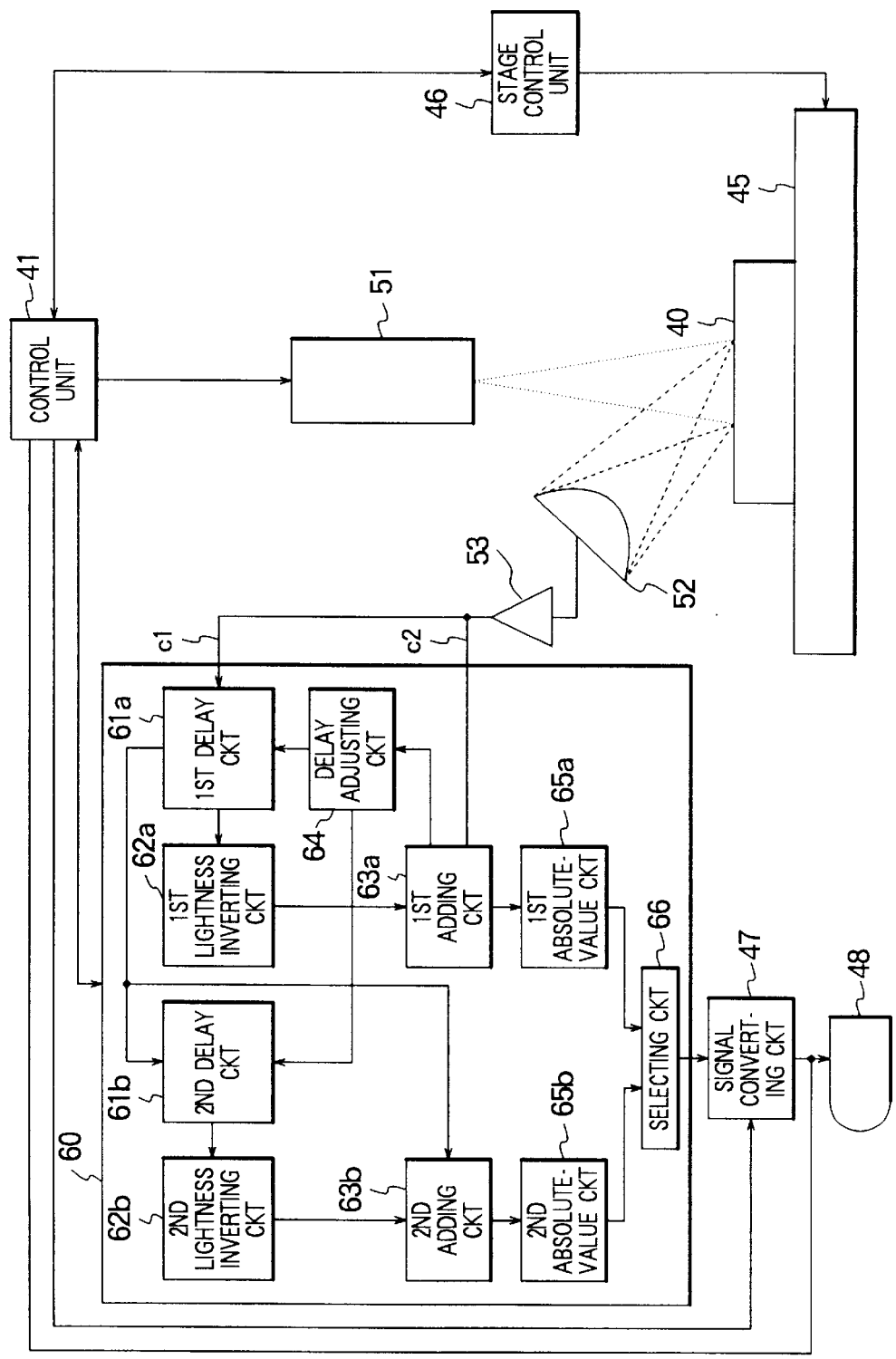
FIG. 7 shows a block diagram of a fine pattern inspection device according to a fourth embodiment of the present invention.

Referring to FIG. 7, the description will proceed to a fine pattern inspection device according to a fourth embodiment of the present invention. The fine pattern inspection device according to the fourth embodiment comprises similar parts illustrated in FIG. 5 except for the image obtaining unit described in conjunction with FIG. 4. Namely, the image obtaining unit comprises the light source 51 for irradiating light onto the inspection sample 40, the image pickup device 52 for picking up the image of the fine pattern by detecting the reflection light reflected from the inspection sample 40, and the serial/parallel converting circuit 53. The light source 51 can be implemented by the halogen lamp while the image pickup device 52 can be implemented by the one-dimensional CCD array. The one-dimensional CCD array produces the parallel image signal. The serial/parallel converting circuit 53 converts the parallel image signal into the serial image signal as the image signal. The stage 45 and the stage control unit 46 serves as the scanning unit by moving the inspection sample 40. In other words, the one-dimensional CCD array can scans the inspection area of the inspection sample 40 by moving the inspection sample 40. Such the scanning operation may be realized by moving the one-dimensional CCD array and the halogen lamp. Furthermore, the image pickup device 52 may be implemented by the two-dimensional CCD array. In this case, it is unnecessary to move the two-dimensional CCD array.

When the inspection is carried out to the semiconductor wafer of the DRAM having the capacity which is equal to 16 Mega-bits by using the fine pattern inspection device according to the fourth embodiment, it is possible to detect the defect pattern element and the position thereof at a high speed which is faster than five times the speed obtained by the conventional fine pattern inspection device described in conjunction with FIG. 1.

What is claimed is:

1. A fine pattern inspection device for inspecting a fine pattern comprising a plurality of pattern elements which have the same form and which are formed on an inspection sample, in order to detect a defect in said plurality of pattern elements by the use of an image derived from said fine pattern, said device comprising:

image obtaining means for obtaining said image from said fine pattern to produce an image signal representing said image, said image signal comprising a plurality of pattern element image signals each of which lasts for a predetermined time duration, said image signal being divided into first and second divided image signals;

a processing unit supplied with said first and said second divided image signals for extracting a defect image and an inverted defect image that is inverted in lightness of said defect image, by carrying out a first process that gives a predetermined delay to said first divided image signal and then inverts the lightness thereof to obtain a processed image signal and carrying out a second process that adds said processed image signal and said second divided image signal to obtain a difference image signal representing a difference image which includes said defect image and said inverted defect image; and image displaying means supplied with said difference image signal for displaying said defect image and said inverted defect image.

2. A fine pattern inspection device as claimed in claim 1, wherein said processing unit comprises:

a delay circuit supplied with said first divided image signal for giving said predetermined delay to said first divided image signal to produce a delayed image signal;

a lightness inverting circuit supplied with said delayed image signal for inverting the lightness of said delayed image signal to produce a lightness inverted image signal as said processed image signal; and an adding circuit supplied with said lightness inverted image signal and said second divided image signal for adding said lightness inverted image signal and said second divided image signal to produce said difference image signal.

3. A fine pattern inspection device as claimed in claim 2, wherein said processing unit further comprises a delay adjusting circuit supplied with said difference image signal for controlling said delay circuit so as to have said predetermined delay which is equal to said predetermined time duration or equal to a multiple of said predetermined time duration by detecting a variance value of the lightness in said difference image signal and by adjusting said predetermined delay so that said variance value becomes equal to a minimum value.

4. A fine pattern inspection device as claimed in claim 3, said inspection sample having a reference position predetermined thereon, said defect image and said inverted defect image being defined by positional information on said difference image, said device detecting a position of said pattern element image having said defect on said inspection sample by the use of said reference position and at least one of said positional information of said defect image and said inverted defect image.

5. A fine pattern inspection device as claimed in one of claims 1 to 4, wherein said image obtaining means is implemented by a scanning electron microscope.

6. A fine pattern inspection device as claimed in one of claims 1 to 4, wherein said image obtaining means comprises:

a laser beam injector for injecting a laser beam;

a reflection beam detector for detecting a reflection laser beam reflected from said inspection sample; and scanning means for scanning said inspection sample by said laser beam.

7. A fine pattern inspection device as claimed in one of claims 1 to 4, wherein said image obtaining means comprises:

a light source for irradiating light onto said inspection sample;

image pickup means for picking up said image by detecting reflection light reflected from said inspection sample; and moving means for moving at least one of said inspection sample and a combination of said light source and said image pickup means.

8. A fine pattern inspection device for inspecting a fine pattern comprising a plurality of fine pattern elements which have the same form and which are formed on an inspection sample, in order to detect a defect in said plurality of fine pattern elements by the use of an image derived from said fine pattern, said device comprising:

image obtaining means for obtaining said image from said fine pattern to produce an image signal representing said image, said image comprising a plurality of fine pattern element image signals each of which lasts for a predetermined time duration, said image signal being divided into first and second divided image signals;

a primary processing unit supplied with said first and said second divided image signals for extracting a primary defect image and a primary inverted defect image that is inverted in lightness of said primary defect image by carrying out a primary first process that gives a predetermined delay to said first divided image signal to produce a primary delayed image signal and then inverts the of said primary delayed image signal to produce a primary inverted image signal in order to obtain a primary processed image signal and carrying out a primary second process that adds said primary processed image signal and said second divided image signal to obtain a primary difference image signal representing a primary difference image which includes said primary defect image and said primary inverted defect image;

a secondary processing unit supplied with said primary delayed image signal for extracting a secondary defect image and a secondary inverted defect image that is inverted in lightness of said secondary defect image by carrying out a secondary first process that gives said predetermined delay to said primary delayed image signal to produce a secondary delayed image signal and then inverts the lightness of said secondary delayed image signal to produces a secondary inverted image signal in order to obtain a secondary processed image signal and carrying out a secondary second process that adds said secondary processed image signal from said primary delayed image signal to obtain a secondary difference image signal representing a secondary difference image which includes said secondary defect image and said secondary inverted defect image;

a first absolute-value circuit supplied with said primary difference image signal for carrying out absolute operation of said primary difference image signal in each of the pattern element images to produce a primary absoluted image signal;

a second absolute-value circuit supplied with said secondary difference image signal for carrying out the absolute operation of said secondary difference image signal in each of the pattern element images to produce a secondary absoluted image signal;

a selecting circuit supplied with said primary and said secondary absoluted image signals for selecting in each of the pattern element images one absoluted image signal that is lower, in absolute value, than another absoluted image signal from said primary and said secondary absoluted image signals to produce a selected image signal representing a selected image which includes said defect image; and image displaying means supplied with said selected image signal for displaying said defect image.

9. A fine pattern inspection device as claimed in claim 8, wherein said primary processing unit comprises:

a first delay circuit supplied with said first divided image signal for giving said predetermined delay to said first divided image signal to produce said primary delayed image signal;

a first lightness inverting circuit supplied with said primary delayed image signal for inverting the lightness of said primary delayed image signal to produce said primary lightness inverted image signal; and a first adding circuit supplied with said primary lightness inverted image signal and said second divided image signal for adding said primary lightness inverted image signal and said second divided image signal to produce said primary difference image signal;

said secondary processing unit comprises:
- a second delay circuit supplied with said primary delayed image signal for giving said predetermined delay to said primary delayed image signal to produce said secondary delayed image signal;
- a second lightness inverting circuit supplied with said secondary delayed image signal for inverting the lightness of said secondary delayed image signal to produce said secondary lightness inverted image signal; and
- a second adding circuit supplied with said secondary lightness inverted image signal and said primary delayed image signal for adding said secondary lightness inverted image signal and said primary delayed image signal to produce said secondary difference image signal.

10. A fine pattern inspection device as claimed in claim 9, wherein said primary processing unit further comprises a delay adjusting circuit supplied with said primary difference image signal for controlling said first and said second delay circuits so as to have said predetermined delay which is equal to said predetermined time duration or equal to a multiple of said predetermined time duration by detecting a variance value of the lightness in said primary difference image signal and by adjusting said predetermined delay so that said variance value becomes equal to a minimum value.

11. A fine pattern inspection device as claimed in one of claims 8 to 10, said inspection sample having a reference position predetermined thereon, said defect image being defined by positional information on said selected image, said device detecting a position of said pattern element having said defect on said inspection sample by the use of said reference position and said positional information of said defect image.

12. A fine pattern inspection device as claimed in one of claims 8 to 10, wherein said image obtaining means is implemented by a scanning electron microscope.

13. A fine pattern inspection device as claimed in one of claims 8 to 10, wherein said image obtaining means comprises:
- a laser beam injector for injecting a laser beam;
- a reflection beam detector for detecting a reflection laser beam reflected from said inspection sample; and
- scanning means for scanning said inspection sample by said laser beam.

14. A fine pattern inspection device as claimed in one of claims 8 to 10, wherein said image obtaining means comprises:
- a light source for irradiating light onto said inspection sample;
- image pickup means for picking up said image by detecting reflection light reflected from said inspection sample; and
- moving means for moving at least one of said inspection sample and a combination of said light source and said image pickup means.

* * * * *